United States Patent
Hubert et al.

(10) Patent No.: US 9,019,760 B2
(45) Date of Patent: Apr. 28, 2015

(54) MULTILEVEL MEMORY DEVICE

(75) Inventors: Alexandre Hubert, Magny les Hameaux (FR); Maryline Bawedin, Montpellier (FR); Sorin Cristoloveanu, Seyssinet Pariset (FR); Thomas Ernst, Morette (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 549 days.

(21) Appl. No.: 13/304,531

(22) Filed: Nov. 25, 2011

(65) Prior Publication Data
US 2012/0134206 A1 May 31, 2012

(30) Foreign Application Priority Data
Nov. 26, 2010 (FR) ...................................... 10 59789

(51) Int. Cl.
| | |
|---|---|
| G11C 11/40 | (2006.01) |
| H01L 27/108 | (2006.01) |
| H01L 29/792 | (2006.01) |
| B82Y 10/00 | (2011.01) |
| H01L 21/28 | (2006.01) |
| H01L 27/115 | (2006.01) |
| H01L 29/06 | (2006.01) |

(52) U.S. Cl.
CPC ............... H01L 29/792 (2013.01); B82Y 10/00 (2013.01); H01L 21/28282 (2013.01); H01L 27/11568 (2013.01); H01L 29/0665 (2013.01); H01L 29/0673 (2013.01)

(58) Field of Classification Search
CPC ............... G11C 11/401; G11C 11/402; G11C 11/4023; G11C 11/403; G11C 11/404; H01L 27/108; H01L 27/10802

USPC .......... 365/184, 222; 257/296, 300, 310, 311
See application file for complete search history.

(56) References Cited

U.S. PATENT DOCUMENTS

| | | |
|---|---|---|
| 2004/0007734 A1 | 1/2004 | Kato et al. |
| 2006/0044870 A1 | 3/2006 | Bhattacharyya et al. |
| 2006/0138521 A1 | 6/2006 | Kang et al. |

(Continued)

FOREIGN PATENT DOCUMENTS

| | | |
|---|---|---|
| EP | 1 918 984 A2 | 5/2008 |
| WO | WO 2007/072396 A2 | 6/2007 |

OTHER PUBLICATIONS

French Preliminary Search Report issued Aug. 3, 2011 in Patent Application No. FR 1059789.

(Continued)

*Primary Examiner* — Allison P Bernstein
(74) *Attorney, Agent, or Firm* — Oblon, McClelland, Maier & Neustadt, L.L.P.

(57) ABSTRACT

A memory device is provided, including a back gate including a first portion of electrically conductive material, a first portion of dielectric material arranged on the back gate, a semiconductor nanobeam arranged on the first portion of dielectric material, a second portion of dielectric material covering the semiconductor nanobeam, a portion of material configured to receive electrons and holes, and configured to store electrical charges and covering the second portion of dielectric material, a third portion of dielectric material covering the portion of material configured to perform storage of electrical charges, and a front gate including a second portion of electrically conductive material covering the third portion of dielectric material.

10 Claims, 5 Drawing Sheets

(56) References Cited

U.S. PATENT DOCUMENTS

| | | | |
|---|---|---|---|
| 2007/0210418 A1* | 9/2007 | Nakajima | 257/547 |
| 2008/0099830 A1 | 5/2008 | Lue et al. | |
| 2008/0108214 A1* | 5/2008 | Majumdar et al. | 438/597 |
| 2008/0272427 A1 | 11/2008 | Van Schaijk et al. | |
| 2008/0304318 A1 | 12/2008 | Wu | |
| 2009/0285030 A1 | 11/2009 | Kang et al. | |
| 2010/0009529 A1* | 1/2010 | Taniguchi et al. | 438/591 |

OTHER PUBLICATIONS

Shih-Ching Chen et al., "A Novel Nanowire Channel Poly-Si TFT Functioning as Transistor and Nonvolatile SONOS Memory", IEEE Electron Device Letters, vol. 28, No. 9, XP011190970, Sep. 1, 2007, pp. 809-811.

Ki-Heung Park et al., "Fully Depleted Double-Gate 1T-DRAM Cell with NVM Function for High Performance and High Density Embedded DRAM", Memory Workshop, 2009. IMW '09. IEEE International, May 10-14, 2009, pp. 32-33.

A. Hubert et al., "A Stacked SONOS Technology, Up to 4 Levels and 6nm Crystalline Nanowires, With Gate-All-Around or Independent Gates (ϕ-Flash), Suitable for Full 3D Integration", IEDM Tech. Dig., 2009, pp. 637-640.

C. Fenouillet-Beranger et al., "FDSOI Devices With Thin BOX and Ground Plane Integration for 32 nm node and Below", Solid-State Electronics, vol. 53, 2009, pp. 730-734.

* cited by examiner

MULTILEVEL MEMORY DEVICE

TECHNICAL FIELD

The invention relates to the field of multilevel memory devices, that is those capable of storing information at several levels, or several bits. The invention relates also to a multilevel memory device used as dynamic memory within an electronic and/or computer device, for example as DRAM (Dynamic Random Access Memory) type memory.

The invention also relates to a programming, or writing, and information readout method in such a memory device.

PRIOR STATE OF THE ART

In a conventional DRAM type memory, the storage of a data bit is carried out by storing electrical charges in a capacitor of the DRAM device. Such a device performs so-called volatile storage because maintaining this storage requires electrical power supplied to the device. In addition, the duration of retention of the electrical charges being very limited, it is not possible to perform multilevel storage of several bits, that is storage of data at several logic levels.

To illustrate this, the curves 10, 12, 14 and 16 of FIG. 1 show the drain current $\Delta I_s$ circulating in a DRAM type memory device for different logic levels stored at different instants t1 through t4, each logic level representing different information, for example encoded in 2 bits: (0,0) for curve 10, (0,1) for curve 12, (1,0) for curve 14 and (1,1) for curve 16. If a readout of the information stored in this device is carried out at the instant t5, it is seen that the value of the current $\Delta$Is obtained is the same no matter what the logic level initially stored. It is therefore not possible to retrieve the value of the logic level initially stored.

Unlike a DRAM memory, a Flash type memory performs non-volatile data storage (the data remain stored in the device when it is no longer supplied with power) and makes it possible to carry out data storage at several logic levels. In these memories, the information is stored in a specific memory layer, for example composed of silicon nitride, arranged between a front gate made of polysilicon and a silicon body of the Flash memory device.

However, in comparison with DRAM type memories, the times needed for performing a write and a read of data in a Flash type memory are very long. Flash type memories are therefore not suited to be used as read/write memory in an electronic and/or computer device. Furthermore, these memories are not suited to undergoing a sufficient number of write-read cycles for reliable use as dynamic memory.

The document "Fully Depleted Double-Gate 1T-DRAM Cell with NVM Function for High Performance and High Density Embedded DRAM" of Ki-Heung Park et al., Memory Workshop, 2009. IMW '09. IEEE International, 10-14 May 2009, pages 1-2, Monterey, Calif., describes a memory device including a dual gate FDSOI transistor (fully depleted transistor on a silicon-on-insulator type substrate) in which the back gate has been functionalized with a memory stack of the ONO (oxide-nitride-oxide) type.

Such a memory device 20 is shown in FIG. 2. This memory device 20 includes a front gate 22, a front gate oxide 24 arranged between the front gate 22 and a silicon body 26 made up of a channel, a source and a drain. The cell 20 also includes a back gate 28 around which is formed a back gate oxide 30, a silicon nitride based memory layer 32 surrounding the back gate oxide 30, and a third oxide 34 used as a tunnel oxide and surrounding the memory layer 32. These elements are formed on a silicon substrate 36.

Although such a memory device makes it possible to have the benefit of the functionalities of a non-volatile memory in a DRAM structure, increasing in particular the programming window and the retention time of the stored information compared with a DRAM memory, such a structure does not allow sufficiently rapid programming and reading to be used as dynamic read/write memory.

Document US 2008/0304318 A1 proposes a Flash type memory device 40 as shown in FIG. 3, including a body 42 on which is placed a memory layer 44, a gate oxide 46 and a gate 48. Compared to a conventional Flash type memory, the memory device 40 does not have a tunnel oxide, which makes it possible to increase the programming and reading speeds of the device.

However, a consequence of the absence of a tunnel oxide is deterioration of the retention time of the stored information, which makes such a memory device incompatible with multilevel storage.

DISCLOSURE OF THE INVENTION

Thus there is a need to propose a new memory device wherein it is possible to perform multilevel storage, that is storage of data at several bits or several logic levels, and the programming and read speeds whereof, as well as the number of programming cycles that can be undergone by the device, are compatible with use as dynamic read/write memory in an electronic and/or computer device.

For this purpose, one embodiment of the present invention proposes a memory device comprising at least:
  a back gate having at least a first portion made of electrically conductive material;
  a first portion of dielectric material arranged on the back gate,
  a semiconductor nanobeam arranged on the first portion of dielectric material,
  a second portion of dielectric material covering at least the semiconductor nanobeam,
  a portion of material capable of performing storage of electrical charges and covering the second portion of dielectric material,
  a third portion of dielectric material covering the portion of material capable of performing storage of electrical charges,
  a front gate comprising at least a second portion of electrically conductive material covering the third portion of dielectric material.

The semiconductor nanobeam can in particular be able to receive electrons and holes.

This device forms a memory cell of the 1T-DRAM (DRAM memory with 1 transistor and having no capacitor) type including an ONO type memory stack, making it possible to perform multilevel non-volatile data storage, arranged on a floating body made up of a nanobeam made of a semiconductor, comprising silicon for example.

The term "semiconductor nanobeam" designates a portion of semiconductor of elongated shape and nanoscale dimensions.

Compared with a conventional DRAM memory cell, this memory device makes it possible to perform multilevel storage, which results, for equal memory capacity, in an improvement in size, hence in the density of memory implementation.

The nanobeam structure of the memory device body makes it possible to reduce the time required for programming and reading data in the device, while still maintaining a stored data retention time that is compatible with multilevel storage. In addition, such a memory device can undergo a number of write/read cycles that is compatible with use as read-write memory in an electronic and/or computer device.

The front gate allows data programming, or writing, into the portion of material capable of performing storage of electrical charges, by the Fowler-Nordheim effect for example, the stored logic level depending on the polarization applied in particular to the front gate. The programming of data into the portion of material capable of performing storage of electrical charges can also be carried out by injection or withdrawal of these charges by hot carriers.

The back gate is used to perform a readout of the data stored by MSD (metastable dip, or drain current hysteresis) effect by first carrying out an injection of holes (majority carriers) by BTBT (band-to-band tunneling) effect into the floating body (the body is said to be floating because no electrical potential is applied directly to the body) and by thereafter maintaining the memory device in a low-accumulation state during the reading of the current circulating in the floating body. Due to the accumulation of holes achieved in the floating body, the potential difference ($\Delta V_{body}$) with respect to the device substrate is increased, which increases the current circulating in the floating body during readout. Thus an effect of dynamic amplification of the current being read is obtained.

The semiconductor nanobeam may have its smallest dimension (diameter or thickness) greater than about 5 nm. In addition, the nanobeam may be made such that this smallest dimension does not exceed a maximum limit beyond which it is no longer possible to obtain complete depletion in the body of the memory device.

The second portion of dielectric material may have a thickness comprised between about 1 nm and 6 nm and/or include HfSiON. With such a second portion of dielectric material, the tunnel barrier formed by this second portion between the nanobeam and the portion of material capable of performing storage of electrical charges is reduced, which accelerates the programming and reading of data in the device while still maintaining a retention time compatible with the use of the memory device as read-write memory in an electronic and/or computer device. The second portion of dielectric material may also comprise several layers of materials, or a multilayer, capable of forming a tunnel barrier.

The portion of material capable of performing storage of electrical charges may be composed of silicon-rich SiN and/or SiN in which are implanted nanocrystals of silicon. Thus, the time required for programming and for reading data in the memory device is further reduced.

The third portion of dielectric material may be composed of at least one dielectric material, the permittivity whereof is greater than 3.9, that is to say a "high-K" type dielectric. Thus the time needed for programming and for reading data in the memory device is further reduced.

The first portion of electrically conductive material of the back gate may include at least a first part composed of P-doped semiconductor and a second part composed of N-doped semiconductor. Thus, such a back gate can be insulated from other back gates of adjacent memory devices, similar for example to the memory device of one embodiment of the invention, and formed on the same substrate as the memory device according to one embodiment of the invention.

Also proposed is a method of programming and reading in a memory device as previously described, comprising at least the following steps:

injection of electrical charges into the portion of the material able to perform storage of electrical charges, thus performing storage in the memory device of one logic level among several logic levels that can be stored in the memory device, the quantity of electrical charges injected being chosen according to the logic level to be stored, injection of holes into the semiconductor nanobeam, amplifying the impact of the electrical charges stored in the portion of material able to perform storage of electrical charges on the current circulating in the semiconductor nanobeam, readout of the current circulating in the semiconductor nanobeam.

Another embodiment of the invention also relates to a method of programming and reading in a memory device comprising at least:

a back gate including at least a first portion of electrically conductive material, a first portion of dielectric material arranged on the back gate, a portion or layer of semiconductor capable of receiving electrons and holes, and arranged on the first portion of dielectric material, a second portion of dielectric material covering at least the semiconductor nanobeam, a portion of material capable of performing storage of electrical charges and covering the second portion of dielectric material, a third portion of dielectric material covering the portion of material capable of performing storage of electrical charges, a front gate including at least a second portion of electrically conductive material covering the third portion of dielectric material, the method comprising at least the following steps:

injection of electrical charges into the portion of material capable of performing storage of electrical charges, thus performing storage in the memory device of one logic level among several logic levels that can be stored in the memory device, the quantity of electrical charges injected being chosen according to the logic level to be stored, injection of holes into the semiconductor nanobeam, amplifying the impact of the electrical charges stored in the portion of material capable of performing storage of electrical charges on the current circulating in the semiconductor nanobeam, readout of the current circulating in the semiconductor nanobeam.

The method can therefore be applied to a memory device including a body made in the form of a portion of semiconductor, such as a nanobeam, or a thin layer of semiconductor. The thickness of the portion or of the layer of semiconductor may for example be greater than about 5 nm.

The readout method allows amplification of the signal connected with the charge in the ONO stack (second portion of dielectric material, portion of material able to perform storage of electrical charges and third portion of dielectric material) and can therefore apply to a readout of any non-volatile memory, regardless of the thickness of the gate oxide and/or the type of gate stack. Amplifying the read signal of a non-volatile memory allows the same information to be read with fewer charges stored in the nitride, which can make it possible for example to reduce the programming voltage of a non-volatile memory.

The injection of electrical charges into the portion of material capable of performing storage of electrical charges may be carried out by applying to the front gate a positive voltage the value whereof depends on the logic level to be stored. This causes a migration of electrical charges, from the semiconductor nanobeam into the portion of material able to perform storage of electrical charges, through the second portion of dielectric material, by tunnel effect.

The injection of holes into the semiconductor nanobeam may be performed by applying a negative voltage on the back gate of the memory device. The holes can be injected by band-to-band tunneling to source/drain junctions (that is the source-channel and/or drain-channel junctions) formed in the semiconductor nanobeam. Such an injection of holes may also be performed by applying a negative voltage on the back gate and a higher voltage on the drain.

The readout of the current circulating in the semiconductor nanobeam may be performed by applying a first, positive voltage on the front gate, a second, negative voltage on the back gate and a third, positive voltage on a drain of the memory device. Thus, the holes previously injected into the semiconductor nanobeam are kept near the back gate during readout, the readout being triggered by the voltages applied to the front gate and the drain.

The voltage applied to the memory device during the programming and reading method may correspond to impulses the duration whereof is comprised between about 10 ns and 50 ns, or between about 5 ns and 50 ns.

The method may also include a step consisting of erasing the logic level stored in the memory device, performed by applying a negative voltage on the front gate of the memory device such that the electrical charges stored in the portion of material able to perform storage of electrical charges are withdrawn from said portion by capacitive coupling.

Another embodiment of the invention also relates to an electronic and/or computer device including a plurality of memory devices such as those previously described.

BRIEF DESCRIPTION OF DRAWINGS

The present invention will be better understood upon reading the description of embodiments given purely by way of indication and with no limitation, with reference to the appended drawings in which.

Identical, similar or equivalent parts of the different figures described hereafter have the same numerical references so as to facilitate passage from one figure to another.

The different parts shown in the figures are not necessarily shown to uniform scale, to make the figures more readable.

The different possibilities (variations and embodiments) must be understood not to be mutually exclusive, and can be combined with one another.

DETAILED DISCLOSURE OF PARTICULAR EMBODIMENTS

Figure 1:
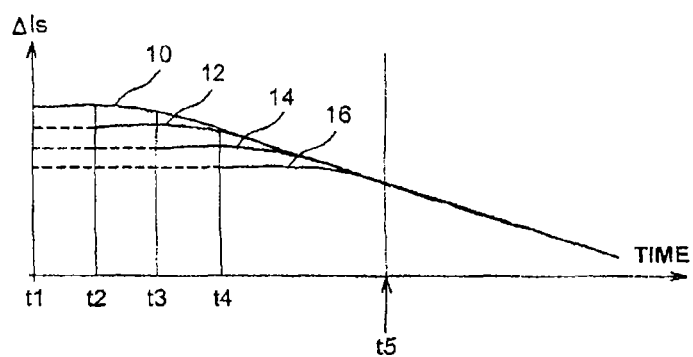
FIG. 1 shows drain currents circulating in a memory device of the DRAM type corresponding to different logic levels stored in the memory device.
Figure 2:
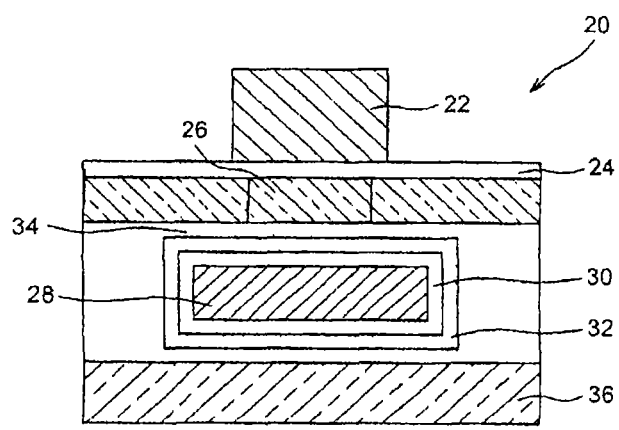
FIG. 2 shows a prior art memory device including a dual gate FSDOI transistor wherein the back gate has been functionalized by an ONO type memory stack.
Figure 3:
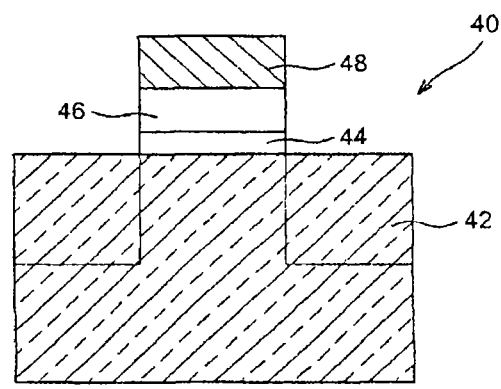
FIG. 3 shows a Flash type memory device according to prior art, which does not include a tunnel oxide.
Figure 4:
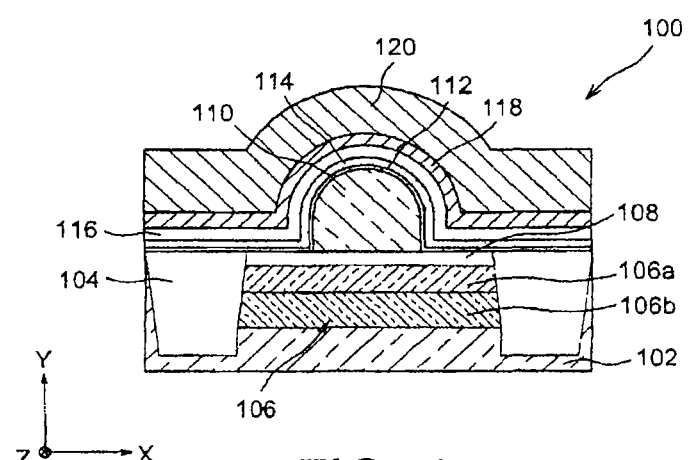
FIG. 4 shows a section view at the active zone of a memory device according to a particular embodiment.

Reference is made first to FIG. 4 which shows a section view of a memory device 100 at its active zone, according to a particular embodiment.

The memory device 100 is made beginning with an SOI substrate comprising a substrate layer made of semiconductor 102, for example silicon, on which is arranged a thin dielectric layer, made of $SiO_2$ for example, and an active semiconductor layer, for example composed of silicon. Insulation zones 104 are made in the semiconductor layer 102 in the form of deep trenches (STI insulation) filled with dielectric material to electrically insulate the memory device 100 from other devices made on the same substrate.

A back gate 106 of the memory device 100 is formed by a doped portion of the semiconductor layer 102, this doping making this portion electrically conductive. This back gate 106 is in contact with a portion 108 of the thin dielectric layer which electrically insulates the back gate 106 from the body of the memory device 100, including a semiconductor nanobeam 110, made here of silicon, made in the active semiconductor layer, and the thickness or the diameter whereof is greater than about 5 nm. The memory device 100 is here of the N+ (source)/P (body)/N+ (drain) type.

The silicon nanobeam 110 is covered with a front gate functionalized to perform non-volatile data storage at several levels. For this purpose, the nanobeam 110 is covered with a first dielectric layer, or portion 112, made for example of an oxide such as $SiO_2$ and forming a tunnel oxide, of a storage layer, or portion 114, for example made of a nitride such as SiN, and of a second dielectric layer or portion 116 made of an oxide such as $SiO_2$. This ONO (oxide-nitride-oxide) stack formed by the layers 112, 114 and 116 is covered with a layer or portion of TiN 118 and with a layer, or portion, of electrically conductive polycrystalline silicon 120 forming the electrically conductive part of the front gate.

This front gate, thus functionalized, makes it possible to inject and to withdraw electrical charges in the storage layer 114 by Fowler-Nordheim effect. Thus, depending on the polarization voltages applied on the memory device 100, it is possible to perform multilevel non-volatile programming of the memory device 100. As a variation of the Fowler-Nordheim effect, it is possible to carry out an injection or a withdrawal of electrical charges in the storage layer 114 by "hot carriers." For that purpose, a voltage the value whereof depends in particular on the thickness of the dielectric layer 112, for example on the order of 2 V, or comprised between about 1 and 4 V for a dielectric layer 112 with a thickness comprised between about 1 nm and 6 nm, is applied on the drain or the source of the memory device 100, bringing about an injection or a withdrawal of charges in the storage layer 114.

In the example shown in FIG. 4, the silicon nanobeam 110 has a section, in the (X,Y) plane (a plane perpendicular to the source-drain axis) the shape whereof corresponds substantially to a half-disk. The nanobeam may have, on the front gate side, a large radius of curvature, comprised for example between about 1 nm and 40 nm. Such a radius of curvature makes it possible to maximize the electric field created at the first dielectric layer 112 and thereby to improve the injection of the electrical charges from the nanobeam 110 into the storage layer 114 by tunnel effect through the oxide layer 112.

The thickness of the first dielectric layer 112 can be reduced in order to reduce the barrier effect between the nanobeam 110 and the storage layer 114, and thus reduce the time needed for programming and for readout of the data in the memory device 100, and so that the retention time of the information in the storage layer 114 remains compatible with operation of the memory device 100 as a dynamic read-write memory. The characteristics of the different elements of the memory device 100 can be selected such that the retention time is for example comprised between 10 s and 1000 s. Thus, the thickness of the first dielectric layer 112 is for example comprised between about 1 nm and 6 nm.

To further reduce the time needed for programming and for reading data in the memory device 100, it is also possible that the first dielectric layer 112 consist of a "band-engineered tunnel barrier" type material, that is it includes a multilayer of materials able to form a tunnel barrier, such as HfSiON and/or other materials containing Hf, O, Al, N, . . . .

The silicon nanobeam 110 may be made by first engraving in the active layer an elongated portion with a substantially rectangular parallelepiped shape. Thereafter, annealing in a hydrogen atmosphere or superficial oxidation in a dry atmosphere and at high temperature is implemented in order to round off the edges of the parallelepiped portion and thus to form the nanobeam 110 the shape of which corresponds substantially to a half-cylinder. It is also possible to make the nanobeam in the form of a nanowire.

The characteristics of this front gate (body of the memory device made in the form of a nanobeam, weak barrier effect of the tunnel dielectric formed by the first dielectric layer 112) allow the memory device 100 to have a write and erase speed compatible with operation of the device 100 as dynamic multilevel memory. In order to further increase the programming and erasing speed in the memory device 100, it is possible for the storage layer 114 to be composed of silicon-rich SiN and/or having silicon nanocrystals, and/or that the first dielectric layer 112 be made of a dielectric having high permittivity (high-K), that is having a dielectric constant greater than 3.9.

The back gate 106 of the memory device 100 makes it possible to carry out, prior to readout of the data stored in the memory device 100, an injection of holes into the body 110 by band-to-band tunneling and to maintain the device 100 in a low-accumulation state during the read operation. These holes are then situated in the body 110, near the base of the body 110, that is at the interface with the oxide 108. Advantageously, it is possible to make the back gate 106 by carrying out a first deep doping, P+ type for example, of the silicon of the layer 102, then a second doping, N+ type for example, of the same silicon. Thus, the back gate 106 has a first zone 106*a* of P-doped silicon on which is arranged a second zone 106*b* of N-doped silicon. This configuration can correspond to the making of a "ground plane" by implantation of dopants and allows the gates to be well insulated from one another. However, N+ type doping prior to the P+ type doping can also be contemplated.

However, it is possible to make the back gate 106 by performing only a single doping in the semiconductor layer 102, or even by making a portion of a metallic material in the buried oxide 108.

Figure 5:
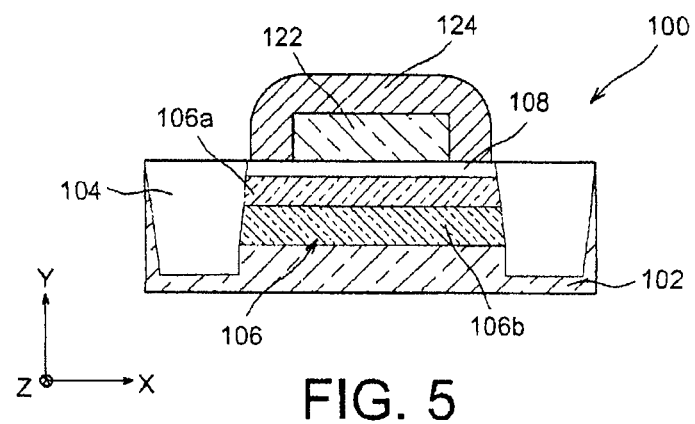
FIG. 5 shows a section view, at the source and drain, of a memory device according to a particular embodiment.

FIG. 5 shows a section view of the memory device 100 at the source of the device 100. In this figure, it is observed that a portion 122 made of silicon, N-doped here, and derived from the active silicon layer of the substrate from which the device 100 is made, is arranged on the part 108 of the dielectric layer and forms the source of the memory device 100. This portion 122 is in contact with the nanobeam 110 and is covered by a portion 124 made of NiSi forming an electrical contact of the portion 122, that is an electrical contact of the source of the memory device 100.

Figure 6:
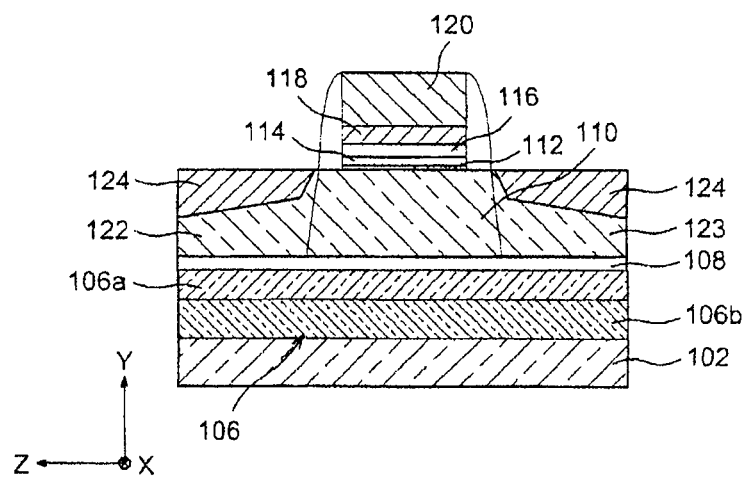
FIG. 6 shows a section view of a memory device according to a particular embodiment, along an axis passing through the source and the drain of the device.

FIG. 6 shows a section view of the memory device along an axis perpendicular to the section axis of the views of FIGS. 4 and 5 and running through the source and the drain of the memory device 100. Found in this figure are the set of elements already described in connection with FIGS. 4 and 5. A drain 123 of the memory device is also shown. The nanobeam 110 extends between the source 122 and the drain 123.

Figure 7:
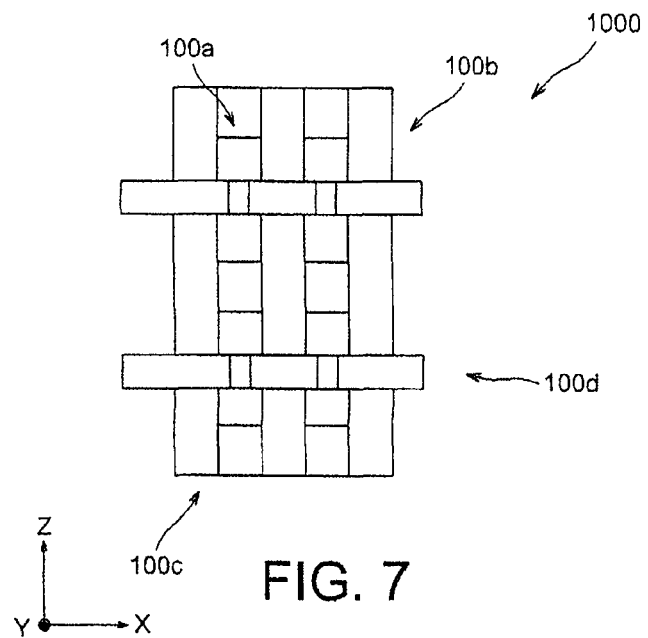
FIG. 7 shows a top view of an electronic device including four memory devices according to a particular embodiment, made on one and the same substrate.

The elements of the memory device 100 can be coupled with other memory devices, for example similar to the memory device 100. FIG. 7 shows an electronic device 1000 having four memory devices 100*a*-100*d*, similar to the memory device 100 described previously and made on one and the same SOI substrate.

Certain elements can be common to all these memory devices 100*a*-100*d*. In the example of FIG. 7, the front gates of the memory devices arranged on one and the same line are electrically interconnected. Likewise the back gates of adjacent memory devices can also be electrically interconnected.

An example of programming and reading out the memory device 100, wherein information corresponding to one of the four different logic levels (corresponding to storage of 2 bits of information) can be stored, will now be described.

The four logic levels will be denoted (1,1), (1,0), (0,1) and (0,0).

Figure 8:
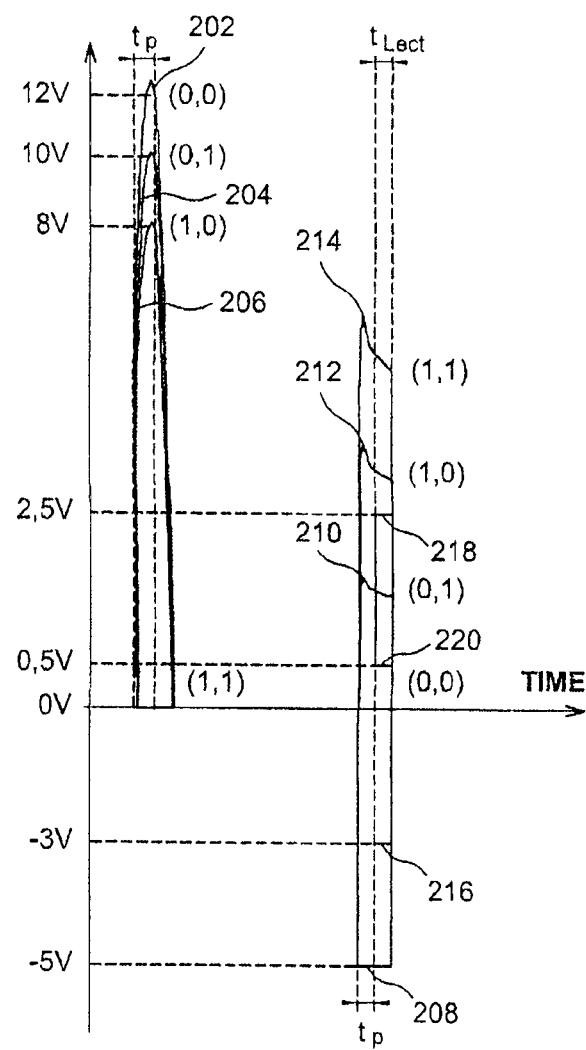
FIG. 8 shows different signals applied to or measured on the memory device shown in FIG. 4 during programming followed by readout of data in the memory device.

FIG. 8 shows different signals applied to or measured on the memory device 100 during storage followed by readout of these different logic levels.

To perform storage in the memory device 100, a voltage is applied to the front gate of the memory device 100, that is on the crystalline polysilicon portion 120, in the form of a pulse having a short duration $t_p$, equal for example to about 10 ns. The intensity of this pulse will depend on the logic level to be stored. Thus, to store the logic level (0,0), the voltage applied to the front gate is for example 12V. To store the logic level (0,1), the voltage applied to the front gate is for example 10V. To store the logic level (1,0), the voltage applied to the front gate is for example 8V. Finally, to store the logic level (1,1), the voltage applied to the front gate is for example zero. During storage of one of these logic levels, a zero voltage is applied to the back gate 102 and on the drain 123 of the memory device 100. During storage, a negative voltage can be applied on the back gate during the non-volatile programming, which makes it possible to substantially increase the front threshold voltage, implying an increase in the programming voltage of the front gate.

The curves 202, 204 and 206 shown in FIG. 8 correspond to the potential measured on the source 122 of the memory device 100 when programming logic levels (0,0), (0,1) and (1,0) respectively. During programming of logic level (1,1), given that a zero voltage is applied on the front gate, the potential of the source remains zero during this programming. The higher the potential applied on the front gate during programming, the lower the drain current level which will be read to determine the stored logic level.

The readout of the logic level stored in the memory device 100 is based on the MSD effect.

During a readout of the logic level stored in the memory device 100, the impact of the nonvolatile charges stored in the memory layer 114 on the current circulating in the nanobeam 110 is amplified by injecting holes into the floating body of the memory device 100, that is into the nanobeam 110, using the back gate 106. This injection is obtained by band-to-band tunneling at the source/channel and drain/channel junctions.

Such amplification is performed by applying a pulse 208 (shown in FIG. 8) of about −5 V on the back gate 106 for a duration $t_P$ equal to about 10 ns. The value of the programming voltage applied on the back gate 106 may be a function of the thickness of the dielectric 108 arranged on the back gate as well as of the doping levels of the source and drain zones. This amplification can be equated to "refreshing" of the stored logic level because, in reaction to this pulse, the potential at the source 122 of the device 100 increases abruptly, its value depending on the logic level stored in the memory device 100. More precisely, it is the potential in the body 110 which increases, making the source-body junction and/or the drain-body junction conducting during readout. Given that during readout the drain voltage can generally be a few hundred millivolts, it is through the body-source junction that the excess holes preferentially escape. As shown in FIG. 8, the source potential of the device reaches peaks 210, 212 and 214 respectively when the stored logic level is (0,1), (1,0) and (1,1). When the stored logic level is (0,0), the source potential remains zero.

The readout, properly so called, of the stored logic level is carried out after this amplification.

For that purpose, the voltage applied on the back gate changes from −5 V to −3 V in order to maintain the memory device 100 in a low accumulation state for the duration of the readout time $t_{Lect}$, equal for example to about 10 ns (reference number 216). This modification of the voltage applied on the back gate, changing from −5 V to −3 V, allows the amplification to be carried out. During programming with a negative voltage (−5 V for example) applied on the back gate, holes are then stored in the body 110 (at the back interface with the dielectric 108), the quantity of holes reaching a maximum if the programming time is sufficiently long. When the voltage changes to −3 V, the quantity of excess holes stored during programming cannot be immediately released, which induces a dynamic augmentation of the potential in the body 110, and hence a reduction of the threshold voltage and a dynamic increase in the current.

A voltage equal to about 2.5 V is also applied (reference number 218) on the front gate (this voltage triggering the readout phase) and a voltage equal to about 0.5 V (reference number 220) on the drain of the memory device 100 for the duration of the readout. The stored datum is then read by measuring the drain current of the memory device 100.

Figure 9:
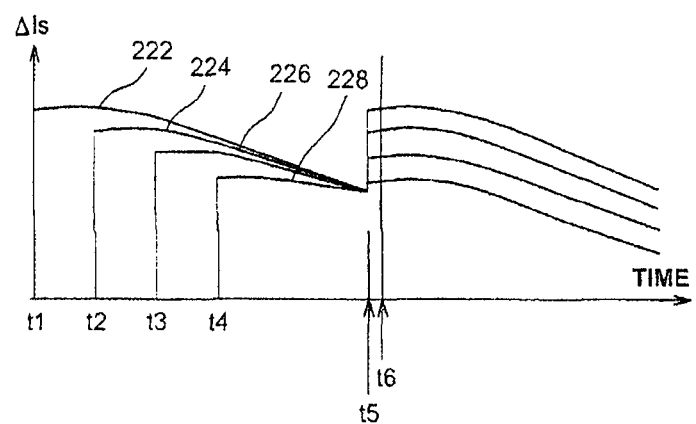
FIG. 9 shows drain currents circulating in the memory device shown in FIG. 4, corresponding to different logic levels stored in the memory device, during programming and reading of those logic levels.

The curves 222, 224, 226 and 228 of FIG. 9 show the drain current $\Delta I_s$ obtained in the memory device 100 for each of the four stored logic levels at instants t1, t2, t3 and t4. At the instant t6, the previously described amplification is performed by injecting holes into the body of the memory device 100, thus returning the drain current to its initial value. By then carrying out a readout at the instant t6, it is observed that the amplification previously described allows recovery of the initial differences between the current levels. The stored logic level is then retrieved because the drain current is representative of the stored logic level and is not confused with the drain current levels obtained due to other logic levels. Furthermore, the current levels obtained can be of the order of several tens of microamperes, which is greater than in a conventional 1T-DRAM device, thus facilitating and accelerating the readout of the stored logic level. Due to the injection of holes carried out in the body of the memory device 100, a threshold voltage offset of about 200 mV is sufficient for differentiating the different stored logic levels.

Erasing of the memory device 100 is carried out by applying on the front gate a voltage in the form of a short pulse (equal for example to about 10 ns) with a high negative value, equal for example to −16 v, resetting to zero the storage state of the memory device 100 by removing the electrical charges stored in the memory layer 114 by capacitive coupling.

Such a programming and readout process can also be implemented for a memory device wherein the body of the device is not a nanobeam 110 as for the memory device 100 described previously, but a thin semiconductor layer the thickness whereof can be greater than about 5 nm.

The invention claimed is:

1. A memory device, comprising:
   a back gate including at least a first portion of electrically conductive material;
   a first portion of dielectric material arranged on the back gate;
   a semiconductor nanobeam configured to receive electrons and holes, arranged on the first portion of dielectric material;
   a second portion of dielectric material covering at least the semiconductor nanobeam, the second portion being connected to the first portion of dielectric material at a first side of the semiconductor nanobeam and at a second side of the semiconductor nanobeam, and extending along the first side, the second side, and an upper surface of the semiconductor nanobeam;
   a portion of material configured to store electrical charges, and covering the second portion of dielectric material;
   a third portion of dielectric material covering the portion of material configured to store electrical charges; and
   a front gate having at least a second portion of electrically conductive material covering the third portion of dielectric material.

2. The memory device according to claim 1, wherein the second portion of dielectric material has a thickness comprised between about 1 nm and 6 nm.

3. The memory device according to claim 1, wherein the second portion of dielectric material includes HfSiON.

4. The memory device according to claim 1, wherein the portion of material configured to store electrical charges is composed of silicon-rich SiN and/or of SiN, wherein silicon nanocrystals are implanted.

5. The memory device according to claim 1, wherein the third portion of dielectric material is composed of at least one dielectric material the permittivity whereof is greater than 3.9.

6. The memory device according to claim 1, wherein the first portion of electrically conductive material of the back gate has at least a first part composed of P-doped semiconductor and a second part composed of N-doped semiconductor.

7. An electronic and/or computer device including a plurality of memory devices according to claim 1.

8. The memory device according to claim 1, wherein at least a portion of the semiconductor nanobeam has a radius of curvature between about 1 nm and about 40 nm.

9. The memory device according to claim 1, wherein a first end of the semiconductor nanobeam is connected to a source region and a second end of the semiconductor nanobeam is connected to a drain region, the second end being opposite to the first end in a longitudinal direction extending between the source region and the drain region.

10. The memory device according to claim 1, wherein
    the semiconductor nanobeam extends in a longitudinal direction between a source region and a drain region, and the upper surface of the semiconductor nanobeam connects the first side of the semiconductor nanobeam to the second side of the semiconductor nanobeam by extending along an arc in a direction orthogonal to the longitudinal direction, the arc having a substantially constant radius of curvature as taken from a point midway between an upper edge of said first side and an upper edge of said second side.

* * * * *